(12) United States Patent
Chowdhury et al.

(10) Patent No.: US 12,548,727 B2
(45) Date of Patent: *Feb. 10, 2026

(54) PACKAGES WITH ELECTRICAL FUSES

(71) Applicant: TEXAS INSTRUMENTS INCORPORATED, Dallas, TX (US)

(72) Inventors: Mahmud Halim Chowdhury, Richardson, TX (US); Amin Sijelmassi, Dallas, TX (US); Murali Kittappa, Plano, TX (US); Anindya Poddar, Sunnyvale, CA (US); Honglin Guo, Dallas, TX (US); Joe Adam Garcia, Royse City, TX (US); John Paul Tellkamp, Rockwall, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/740,456

(22) Filed: Jun. 11, 2024

(65) Prior Publication Data

US 2024/0332243 A1    Oct. 3, 2024

Related U.S. Application Data

(63) Continuation of application No. 17/390,823, filed on Jul. 30, 2021, now Pat. No. 12,009,336.

(51) Int. Cl.
*H01L 23/00* (2006.01)
*H01H 85/02* (2006.01)
*H01L 23/495* (2006.01)
*H01L 23/498* (2006.01)

(52) U.S. Cl.
CPC ......... *H01L 24/48* (2013.01); *H01H 85/0241* (2013.01); *H01L 24/49* (2013.01); *H01L 24/85* (2013.01); *H01H 2085/0283* (2013.01); *H01L 23/49555* (2013.01); *H01L 23/49827* (2013.01); *H01L 24/73* (2013.01); *H01L 2224/4801* (2013.01); *H01L 2224/48175* (2013.01); *H01L 2224/48227* (2013.01); *H01L 2224/48455* (2013.01); *H01L 2224/4846* (2013.01); *H01L 2224/48479* (2013.01); *H01L 2224/48499* (2013.01); *H01L 2224/49111* (2013.01); *H01L 2224/494* (2013.01); *H01L 2224/73265* (2013.01); *H01L 2224/85051* (2013.01); *H01L 2224/85186* (2013.01); *H01L 2224/8534* (2013.01); *H01L 2924/01013* (2013.01); *H01L 2924/01079* (2013.01); *H01L 2924/2064* (2013.01); *H01L 2924/2075* (2013.01)

(58) Field of Classification Search
CPC ..... H01H 85/0241; H01L 24/48; H01L 24/49; H01L 24/85
USPC ......................................................... 257/738
See application file for complete search history.

(56) References Cited

U.S. PATENT DOCUMENTS 12,009,336 B2 *   6/2024   Chowdhury ............ H01L 24/85
2022/0319988 A1   10/2022  Tuncer

* cited by examiner

*Primary Examiner* — Jasmine J Clark
(74) *Attorney, Agent, or Firm* — Dawn Jos; Frank D. Cimino

(57) ABSTRACT

In examples, a package comprises a semiconductor die having a device side and a bond pad on the device side, a conductive terminal exposed to an exterior of the package, and an electrical fuse. The electrical fuse comprises a conductive ball coupled to the bond pad, and a bond wire coupled to the conductive terminal. The bond wire is stitch-bonded to the conductive ball.

15 Claims, 15 Drawing Sheets

PACKAGES WITH ELECTRICAL FUSES

This application is a continuation of patent application Ser. No. 17/390,823, filed Jul. 30, 2021 (now U.S. Pat. No. 12,009,336), the contents of which are herein incorporated by reference in its entirety.

BACKGROUND

Semiconductor chips are housed inside packages that protect the chips from deleterious environmental influences, such as heat, moisture, and debris. A packaged chip generally communicates with electronic devices outside the package via conductive members (e.g., leads) that are exposed to outer surfaces of the package. Some packages include substrates on which the semiconductor die is positioned. The substrate may include multiple metal layers, or traces, that carry electrical signals or power.

SUMMARY

In examples, a package comprises a semiconductor die having a device side and a bond pad on the device side, a conductive terminal exposed to an exterior of the package, and an electrical fuse. The electrical fuse comprises a conductive ball coupled to the bond pad, and a bond wire coupled to the conductive terminal. The bond wire is stitch-bonded to the conductive ball.

In examples, a method comprises performing a first electronic flame-off (EFO) to a bond wire in a wirebonding capillary to produce a first conductive ball, coupling the first conductive ball to a bond pad of a semiconductor die, disconnecting the bond wire from the first conductive ball, performing a second EFO to the bond wire in the wirebonding capillary to produce a second conductive ball, coupling the second conductive ball to a conductive terminal, the bond wire coupled to the second conductive ball, and stitch-bonding the bond wire to the first conductive ball to form an electrical fuse, the bond wire having a diameter ranging from 0.6 mils to 2.5 mils.

BRIEF DESCRIPTION OF THE DRAWINGS

For a detailed description of various examples, reference will now be made to the accompanying drawings in which.

DETAILED DESCRIPTION

As described above, semiconductor chips are housed inside packages that protect the chips from deleterious environmental influences, such as heat, moisture, and debris. In some applications, such as high-power applications, packages may be vulnerable to electrical damage. For example, a package covering a gate driver integrated circuit (IC) that drives a switching power supply may be configured to handle a maximum of 30 volts (V) and a maximum of 20 amperes (amps), but under certain conditions, such as a short in the switching power supply, the gate driver IC may receive 400 V or more, which may correspond to 1500 amps or more. This electrical overload represents a significant rise in heat, causing metals in the package (e.g., metal traces, bond wires) to boil and resulting in a violent burst of energy that damages the mold compound of the package.

This disclosure describes various examples of a semiconductor package that overcomes the challenge described above. In particular, the semiconductor package described herein includes an electrical fuse that opens in response to the package receiving high voltages or currents that generate a threshold amount of heat. By opening when a threshold amount of heat has been generated, the electrical fuse protects the semiconductor die in the semiconductor package and the mold compound of the semiconductor package from the damage described above. In examples, the semiconductor package comprises a semiconductor die having a device side and a bond pad on the device side. The package also includes a conductive terminal exposed to an exterior of the package. The package comprises an electrical fuse, which includes a conductive ball coupled to the bond pad and a bond wire coupled to the conductive terminal. The bond wire is stitch-bonded to the conductive ball. The contact area of the interface between the bond wire and the conductive ball is controlled to cause the electrical fuse to open at a threshold heat level.

Figure 1:
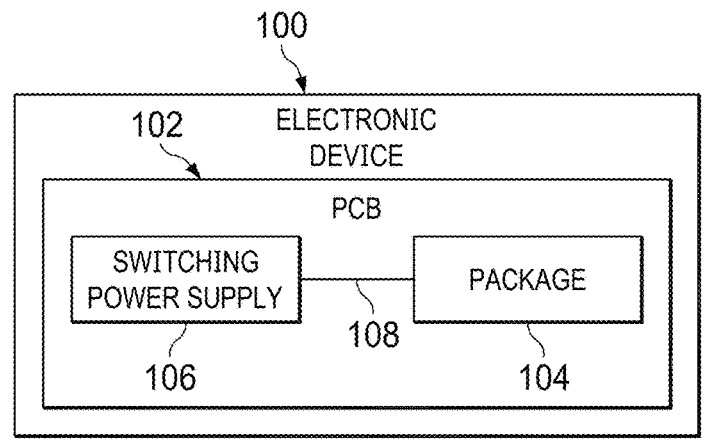
FIG. 1 is a block diagram of an electronic device including a package having an electrical fuse in accordance with various examples.

FIG. 1 is a block diagram of an electronic device 100 including a package having an electrical fuse in accordance with various examples. In particular, the electronic device 100 may be a laptop computer, a notebook computer, a desktop computer, a smartphone, an appliance (e.g., a refrigerator, a laundry machine, an oven, a toaster), a television, an automobile or a component within an automobile, an aircraft or a component within an aircraft, a water vehicle or a component within a water vehicle, or any other type of device containing one or more electronic components. In examples, the electronic device 100 includes a printed circuit board (PCB) 102. Various components may be coupled to the PCB 102, such as a semiconductor package 104 and a switching power supply 106. The package 104 and the power supply 106 may be coupled to each other by way of a conductive trace 108, such as a conductive trace formed on the PCB 102. In examples, the package 104 includes a driver integrated circuit (IC) that is configured to drive the switching power supply 106. The switching power supply 106, in turn, is configured to provide power to one or more electronic components within the electronic device 100. For example, the switching power supply 106 may be configured to provide power to another electronic component (not expressly shown) on the PCB 102. In examples, the package 104 includes one or more instances of the electrical fuses described herein, such as along a high-current electrical pathway between the driver IC of the package 104 and the pin(s) of the package 104 that couple to the switching power supply 106 via the conductive trace 108.

Figure 2A:
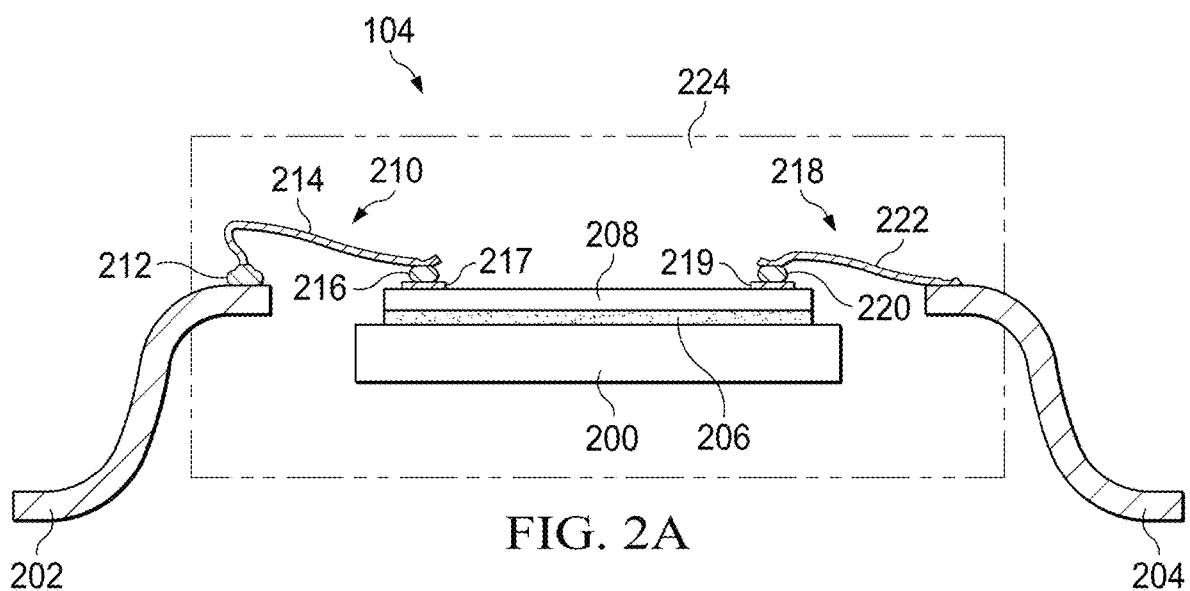
FIG. 2A is a profile cross-sectional view of a package having an electrical fuse in accordance with various examples.

FIG. 2A is a profile cross-sectional view of the package 104 in accordance with various examples. The illustrative package 104 is a dual in-line package having gullwing-style leads, although other types of packages, such as BGA and QFN packages, are contemplated and included in the scope of this disclosure. The package 104 includes a die pad 200, a conductive terminal (e.g., lead, also referred to herein as a conductive pathway) 202, and a conductive terminal (e.g., lead, also referred to herein as a conductive pathway) 204. The conductive terminals 202, 204 are accessible from within the package 104 and are exposed to an exterior of the package 104. A die attach layer 206 abuts the die pad 200, and a semiconductor die 208 abuts the die attach layer 206. Thus, the die attach layer 206 couples the semiconductor die 208 to the die pad 200. The semiconductor die 208 has a device side in which circuitry is formed, and, in examples, this device side faces upward. The semiconductor die 208 has a non-device side opposing the device side, and, in examples, this non-device side faces downward.

The package 104 includes an electrical fuse 210, in accordance with various examples. The electrical fuse 210 includes a conductive member 212, a bond wire 214, and a conductive member 216. The conductive member 216 is coupled to a bond pad 217 on the device side of the semiconductor die 208. In examples, the conductive members 212, 216 are conductive balls, such as gold or aluminum balls. Other materials are contemplated and included in the scope of this disclosure.

The package 104 also includes an electrical fuse 218. The electrical fuse 218 includes a conductive member 220 and a bond wire 222. The conductive member 220 is coupled to a bond pad 219, which is on the device side of the semiconductor die 208. In examples, the conductive member 220 is a conductive ball, such as a gold or aluminum ball, although other materials are contemplated and included in the scope of this disclosure. The bond wire 222 has a diameter in the range of 0.6 mils to 2.5 mils, with a bond wire 222 diameter larger than this range being disadvantageous because it results in an electrical fuse opening threshold being unacceptably high, and with a bond wire 222 diameter smaller than this range being disadvantageous because it would not allow for sufficient current carrying capability during normal operations. The conductive member 220 has a height that is 55-65% of the bond wire 222 diameter, which ranges from 0.6 mils to 2.5 mils. Thus, the conductive member 220 has a height ranging from 0.33 mils to 1.625 mils, with a height larger than this range being disadvantageous because it implicates an unacceptably large bond wire diameter as described above, and with a height smaller than this range being disadvantageous because it implicates an unacceptably small bond wire diameter as described above. A mold compound 224 covers some or all of the structures of the package 104 described above.

With regard to the electrical fuse 210, the bond wire 214 couples the conductive member 212 to the conductive member 216. The electrical fuse 210 may be formed using a wirebonding capillary, for example. For instance, a wirebonding capillary (not expressly shown) may emit a segment of bond wire that is subjected to an electronic flame off (EFO), causing the bond wire to form the conductive member (e.g., conductive ball) 216. The conductive member 216 is coupled to the bond pad 217. The bond wire 214 has a diameter in the range provided above for the bond wire 222, with the same disadvantages as those explained above when the bond wire 214 diameter is outside this range. The conductive member 216 has a height that is 55-65% of the diameter of the bond wire 214. Thus, the conductive member 216 has a height in the range provided above for the conductive member 220, with the same disadvantages as those explained above when the conductive member 216 height is outside this range. The bond wire of the wirebonding capillary may be suitably clamped and the wirebonding capillary be suitably moved to disconnect the conductive member 216 from the bond wire provided by the wirebonding capillary. A segment of bond wire provided by the wirebonding capillary may then be subjected to an EFO that causes the bond wire to form the conductive member (e.g., conductive ball) 212. The conductive member 212 is coupled to the conductive terminal 202. The wirebonding capillary may then be moved in a pattern and the clamp of the wirebonding capillary may be opened and closed during the movement pattern to produce the bond wire 214 having the specific length and structure shown. A distal end of the bond wire 214 relative to the conductive member 212 may be stitch-bonded to the top of the conductive member 216.

With regard to the electrical fuse 218, the bond wire 222 couples the conductive member 220 to the conductive terminal 204. An EFO may be used to form the conductive member 220, which is subsequently coupled to the bond pad 219. One end of the bond wire 222 may be wedge-bonded to the conductive terminal 204, and the opposing end of the bond wire 222 may be wedge-bonded to the conductive member 220.

Figure 2B:
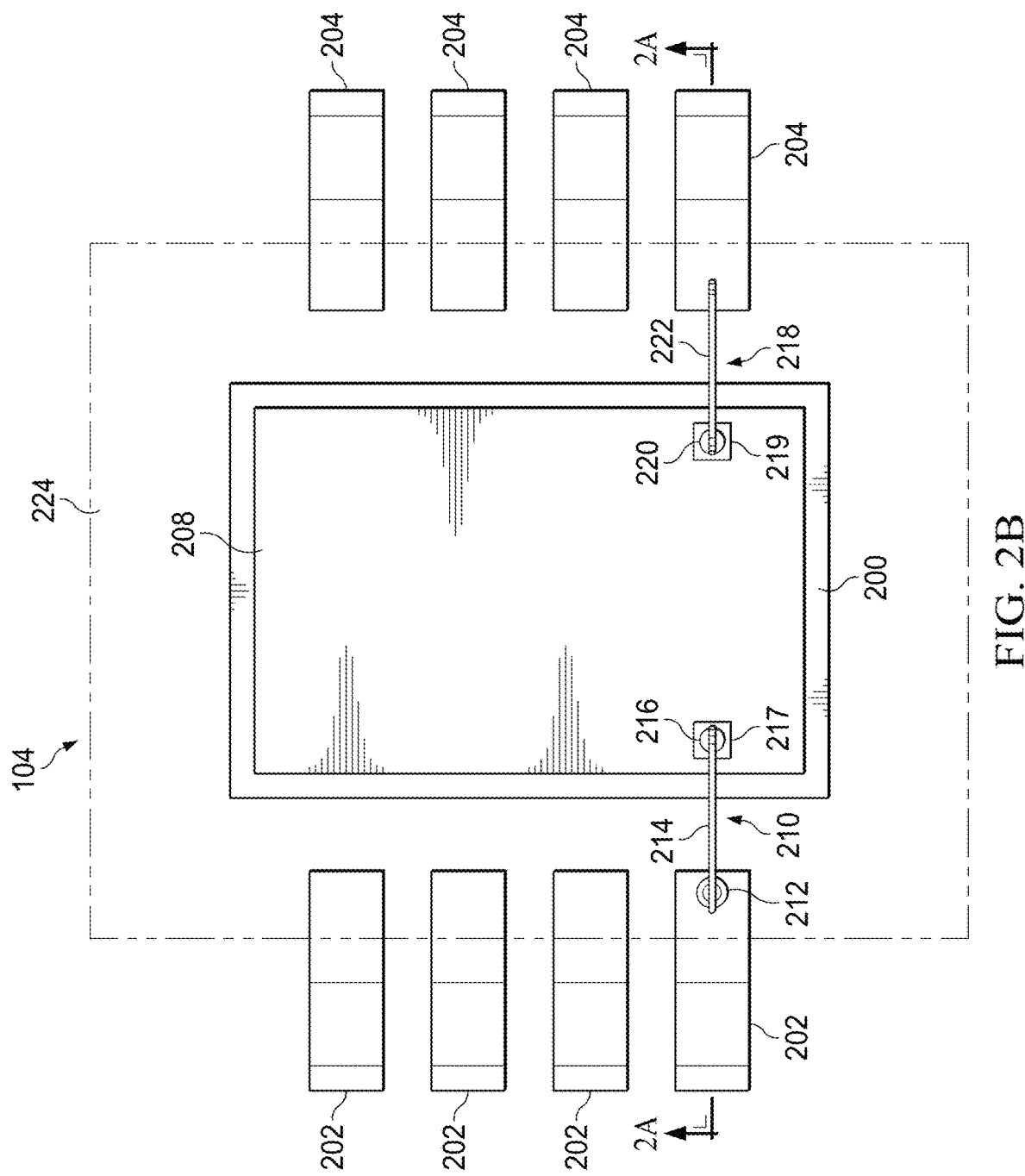
FIG. 2B is a top-down view of a package having an electrical fuse in accordance with various examples.
Figure 2C:
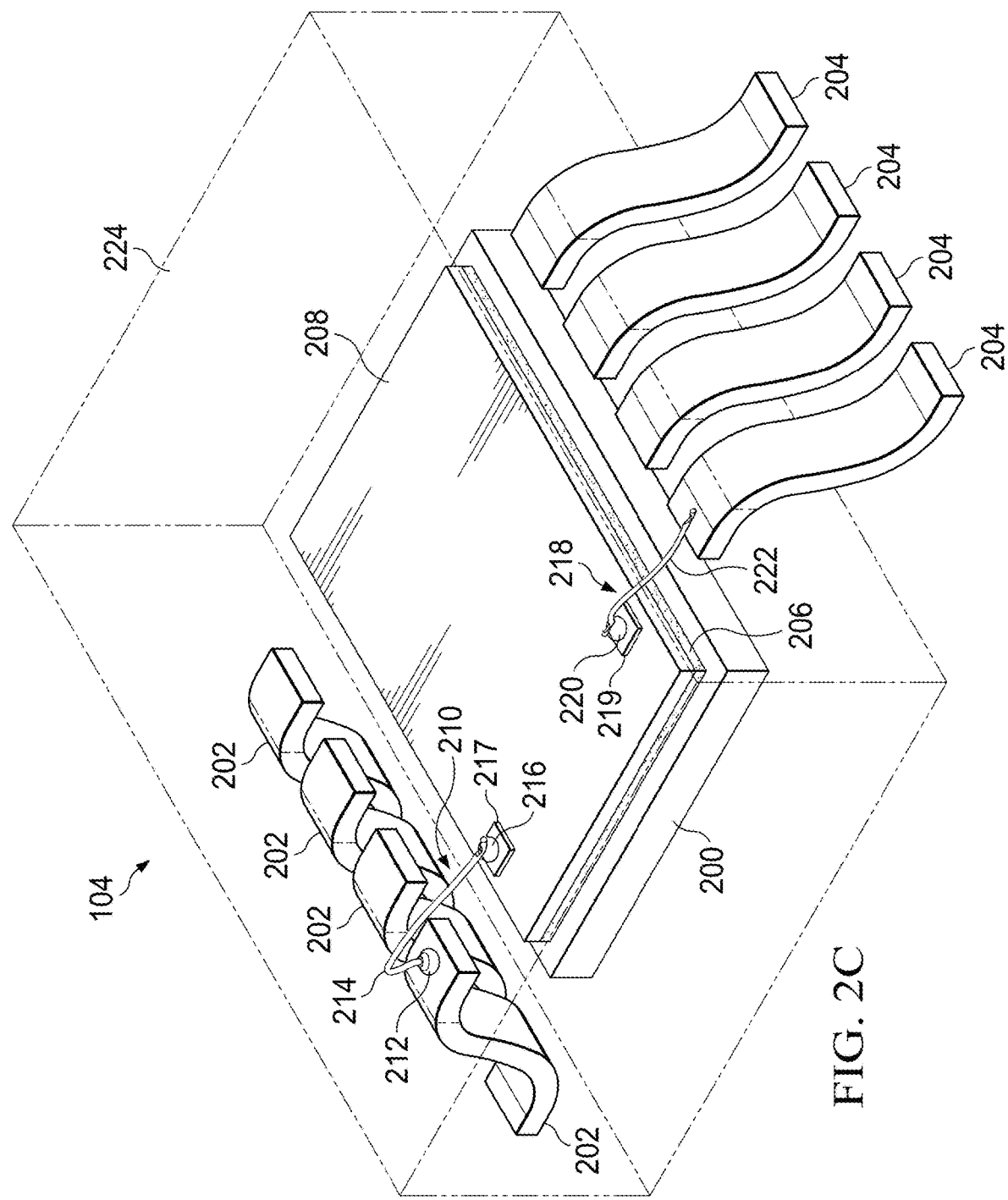
FIG. 2C is a perspective view of a package having an electrical fuse in accordance with various examples.

The foregoing examples assume the use of wirebonding capillaries and wedge bonders for the formation of stitch and wedge bonds. However, a variety of techniques and equipment may be useful to form the structures described herein and equivalents and variations thereof. Further, although FIG. 2A depicts two electrical fuses, any number of electrical fuses (e.g., one or more electrical fuses) may be present. FIG. 2B is a top-down view of the structure of FIG. 2A. FIG. 2C is a perspective view of the structure of FIG. 2A.

Figure 3A:
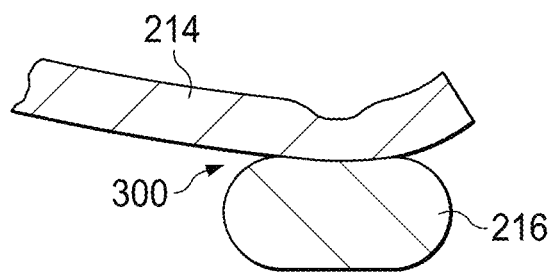
FIGS. 3A-3C are profile cross-sectional, top-down, and perspective views of an interface in an electrical fuse in accordance with various examples.
Figure 3B:
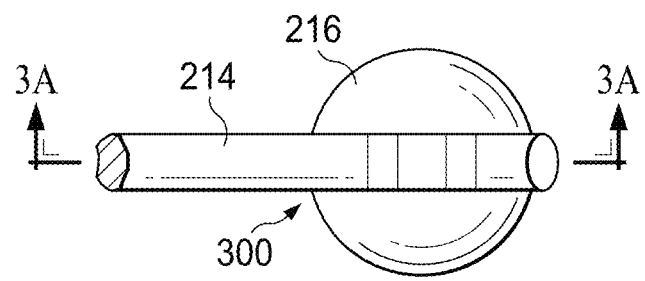
Figure 3C:
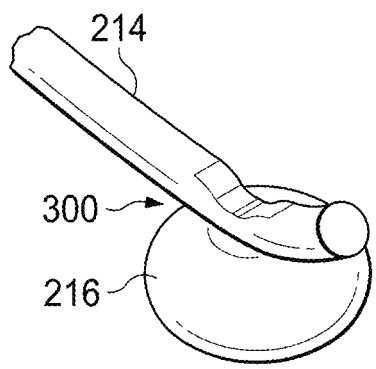

FIG. 3A is a profile cross-sectional view of an interface in the electrical fuse 210, in accordance with various examples. As FIG. 3A shows, the bond wire 214 is stitch-bonded to the conductive member 216 at an interface 300. The interface 300 is the contact point between the bond wire 214 and the conductive member 216. The contact area of the interface 300 determines the heat threshold at which the electrical fuse 210 will open. The contact area of the interface 300 is controlled by adjusting factors including the diameter of the bond wire 214 and the stitch offset. The term stitch offset, as used herein, is the horizontal distance between the vertical centerline of the conductive member 216 and the vertical plane in which the wirebonding capillary descends to establish the stitch bond between the bond wire 214 and the conductive member 216. Thus, a larger positive stitch offset means that the wirebonding capillary descends farther to the left of the vertical centerline of the conductive member 216, and a smaller positive stitch offset means that the wirebonding capillary descends closer to the left of the vertical centerline of the conductive member 216. A negative stitch offset means the wirebonding capillary descends in a vertical plane to the right of the vertical centerline of the conductive member 216, with a smaller negative stitch offset (i.e., smaller absolute value) being to the right and more proximal to the vertical centerline of the conductive member 216, and with a larger negative stitch offset (i.e., larger absolute value) being to the right and more distal to the vertical centerline of the conductive member 216. The absolute value of a positive or negative stitch offset does not exceed 30% of the bond wire diameter, because a larger positive stitch offset would detrimentally affect reliability and mechanical integrity of the bond wire connection and make the contact area of the interface 300 unacceptable small, and a larger negative stitch offset (i.e., absolute value of the negative stitch offset exceeding 30% of the bond wire diameter) would present unacceptable manufacturing challenges. FIG. 3B is a top-down view of the structure of FIG. 3A, and FIG. 3C is a perspective view of the structure of FIG. 3A.

Figure 3D:
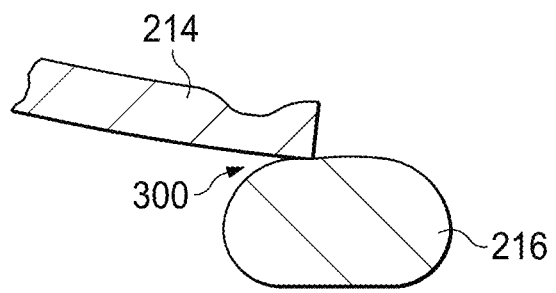
FIGS. 3D-3F are profile cross-sectional, top-down, and perspective views of an interface in an electrical fuse in accordance with various examples.
Figure 3E:
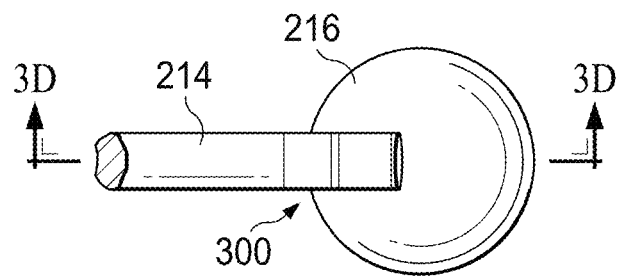
Figure 3F:
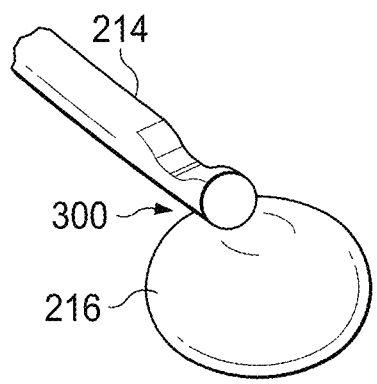

Thus, the contact area of the interface 300 may be controlled by adjusting the stitch offset applied by the wirebonding capillary as it forms the electrical fuse 210. For example, increasing or decreasing the stitch offset may affect the contact area of the interface 300, assuming there is no change in bond wire 214 length. Similarly, maintaining a constant stitch offset while adjusting the bond wire length may also increase or decrease the contact area of the interface 300. Similarly, a combination of stitch offset adjustment and bond wire length adjustment may increase or decrease the contact area of the interface 300. For example, FIG. 3D shows the contact area-decreasing effect (relative to FIG. 3A) of a large positive stitch offset or a decrease in bond wire length. FIG. 3E is a top-down view of the structure of FIG. 3D, and FIG. 3F is a perspective view of the structure of FIG. 3D.

The contact area of the interface 300 defines the heat threshold (i.e., temperature), and, thus, the current and the voltage, at which the electrical fuse 210 opens. In particular, a smaller contact area of the interface 300 may cause the electrical fuse 210 to open at a lower temperature, and a larger contact area of the interface 300 may cause the electrical fuse 210 to open at a higher temperature. Thus, the stitch offset, bond wire diameter, and/or bond wire length, all of which impact the contact area of the interface 300, may be adjusted to control the temperature (and thus the current and voltage) at which the electrical fuse 210 opens. In addition to potentially affecting the contact area of the interface 300, the bond wire length may affect the overall impedance of the electrical fuse, thereby impacting the temperature of the fuse. For example, a greater bond wire length results in a greater overall impedance, thereby raising the temperature of the electrical fuse and hastening the opening of the electrical fuse. Conversely, a lesser bond wire length results in a lower overall impedance, thereby reducing the temperature of the electrical fuse and delaying the opening of the electrical fuse. Similarly, bond wire diameter (with suitable bond wire diameters provided above) affects the impedance of the electrical fuse, thereby impacting the temperature of the fuse. In sum, various factors may affect the temperature at which the electrical fuse 210 opens, including bond wire length, stitch offset, and bond wire diameter, and at least some of these factors may also affect the temperature of the electrical fuse 210. These parameters may be adjusted as suitable to achieve a target behavior of the electrical fuse 210. Although a different type of bonding device (e.g., a wedge bonder) may be used to form the electrical fuse 218, similar principles apply to the heat threshold at which the electrical fuse 218 opens, and similar principles apply to the rate at which the temperature of the electrical fuse 218 increases.

In operation, the electrical fuse 210 may form a segment of an electrical pathway between the semiconductor die 208 and the switching power supply 106 (FIGS. 1 and 2A). This electrical pathway may carry relatively high currents and/or high voltages, and the pathway may be susceptible to electrical overload conditions. Responsive to the presence of an electrical overload condition (e.g., as defined by the temperature at which the electrical fuse 210 opens, which, in turn, may be defined at least in part by the contact area of the interface 300), the electrical fuse 210 opens, breaking the electrical pathway and mitigating the various types of damage described above, including mold compound 224 damage.

The description of the interface 300 (including stitch offsets, bond wire diameters, and bond wire lengths that impact the contact area of the interface 300) in the electrical fuse 210 provided herein is also applicable to a similar interface that is present in the electrical fuse 218, such as between the conductive member 220 and the bond wire 222.

Figure 4A:
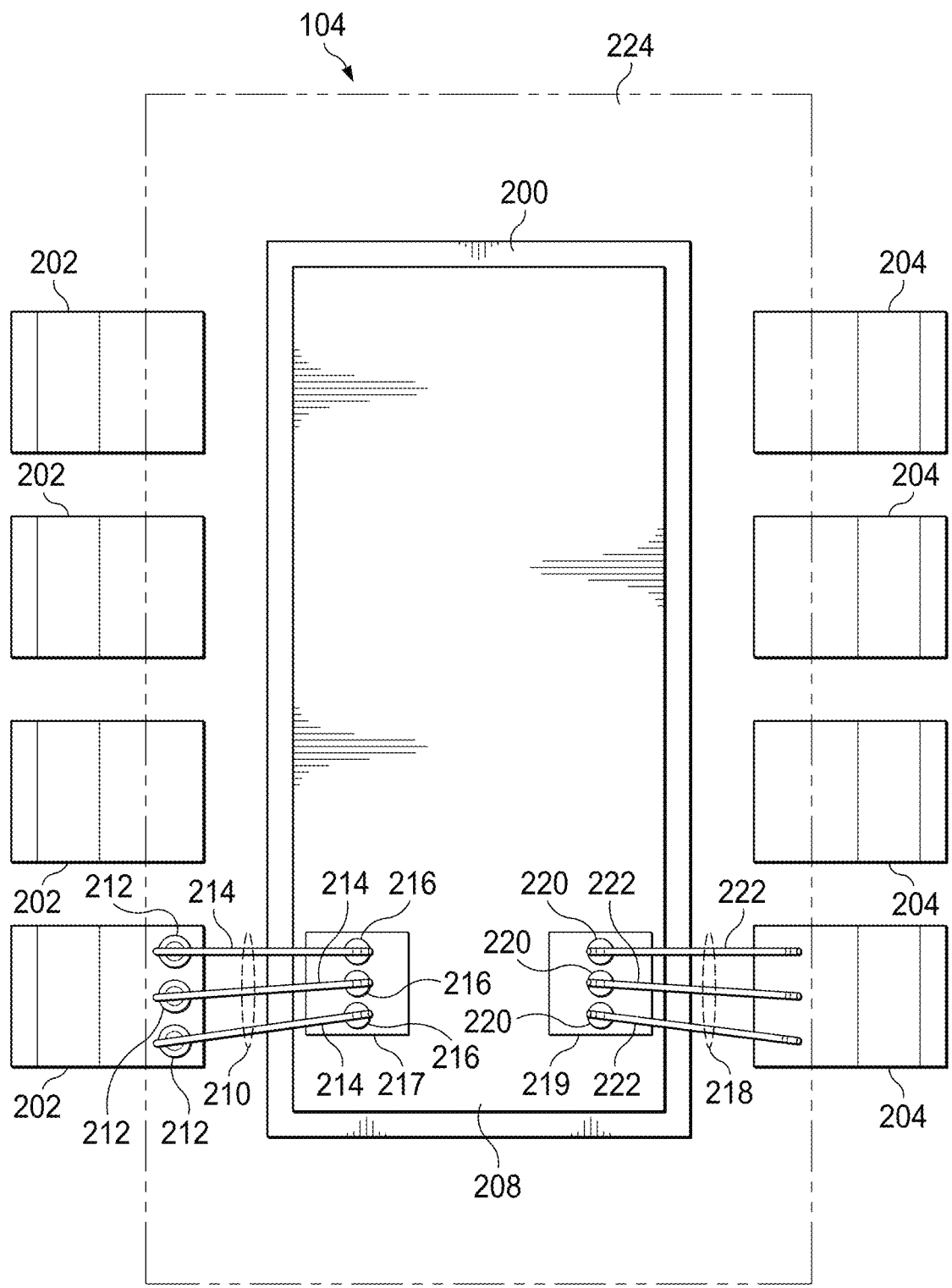
FIG. 4A is a top-down view of a package having multiple electrical fuses in accordance with various examples.
Figure 4B:
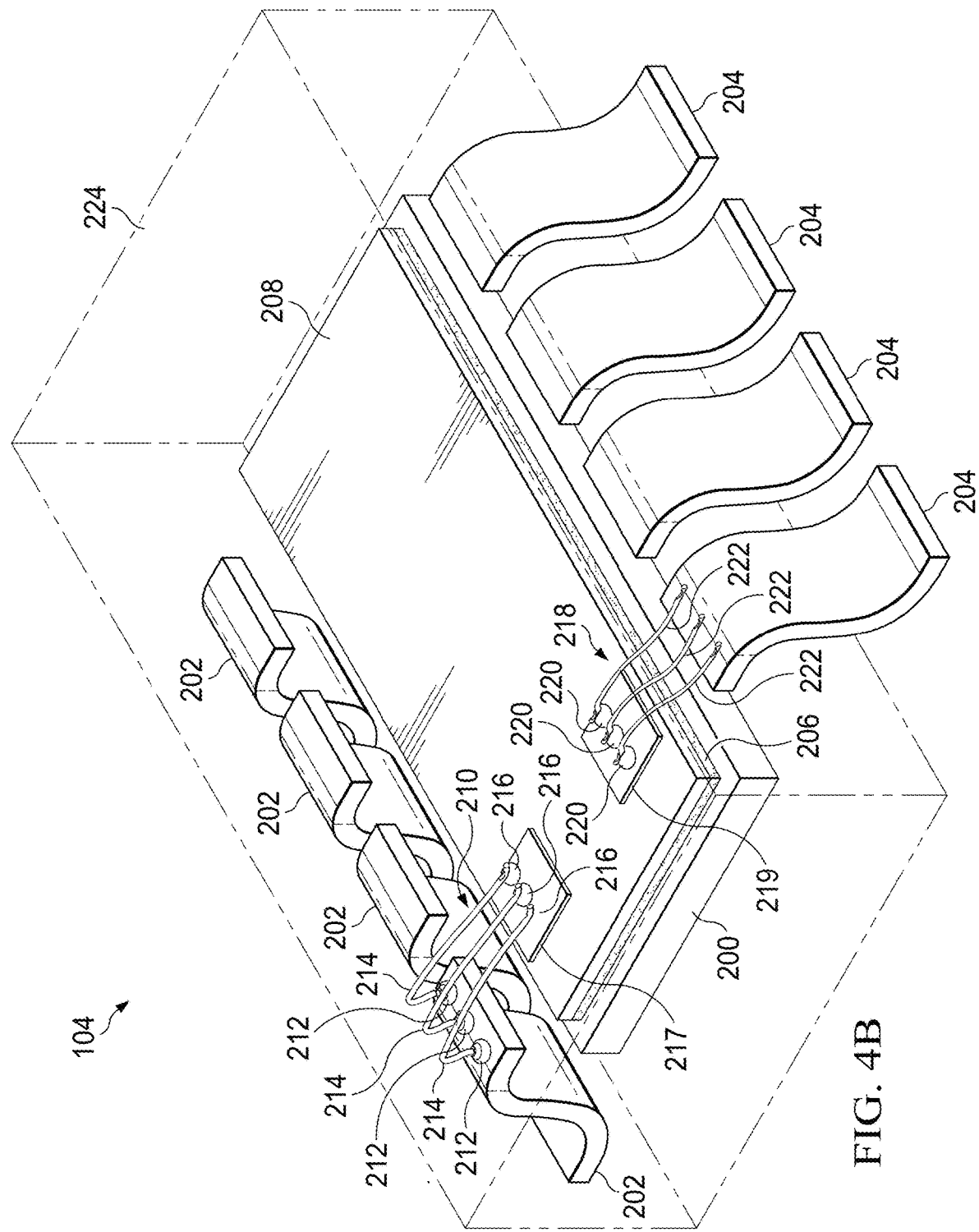
FIG. 4B is a perspective view of a package having multiple electrical fuses in accordance with various examples.

As described above, example packages 104 may have any suitable number of electrical fuses. FIG. 4A is a top-down view of the package 104 having multiple electrical fuses 210 coupled to the conductive terminal 202 and to the bond pad 217. Thus, the multiple electrical fuses 210 are coupled in parallel. The example package 104 in FIG. 4A also has multiple electrical fuses 218 coupled to the conductive terminal 204 and to the bond pad 219. Thus, the multiple electrical fuses 218 are coupled in parallel. In examples, multiple electrical fuses 210, 218 may be coupled in parallel. In examples having multiple electrical fuses coupled in parallel, current may flow through all of the electrical fuses in parallel, and thus the contact area of each interface 300 among all electrical fuses coupled in parallel should be adjusted to target values to achieve a desired temperature at which all fuses are open and the electrical pathway is fully broken. FIG. 4B is a perspective view of the package 104 in accordance with various examples.

Figure 5A:
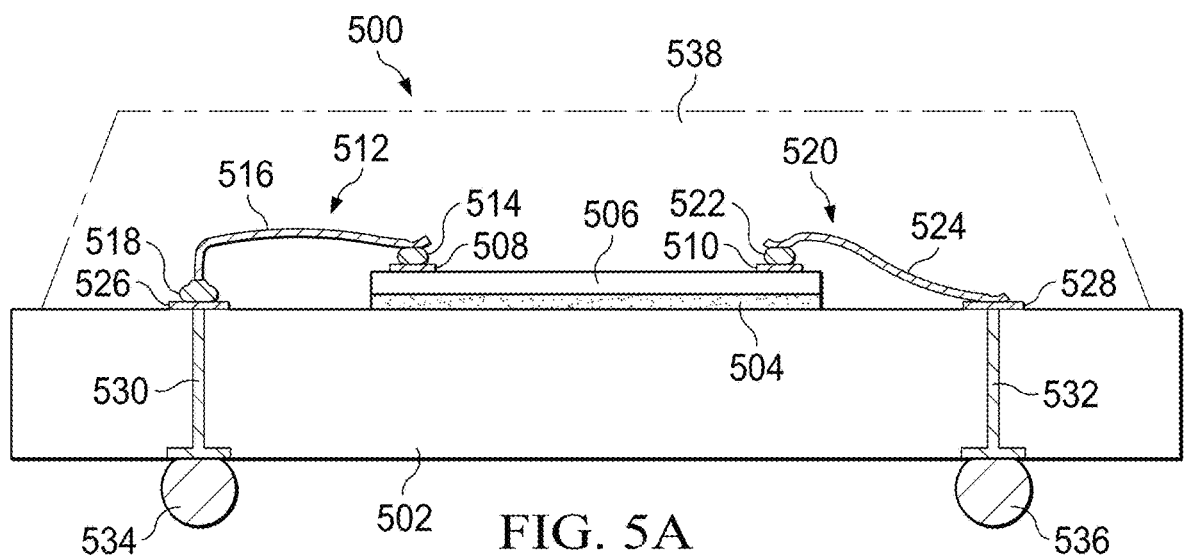
FIG. 5A is a profile cross-sectional view of a ball grid array (BGA) package having an electrical fuse in accordance with various examples.

FIG. 5A is a profile cross-sectional view of a ball grid array (BGA) package 500 having an electrical fuse in accordance with various examples. The BGA package 500 may be coupled to the PCB 102 of FIG. 1 in place of the package 104. In examples, the BGA package 500 includes a substrate 502, a die attach layer 504 coupled to the substrate 502, and a semiconductor die 506 coupled to the die attach layer 504. The semiconductor die 506 has an upward-facing device side and a downward-facing non-device side. The device side of the semiconductor die 506 includes bond pads 508 and 510. An electrical fuse 512 includes a conductive member 514, a bond wire 516, and a conductive member 518. The conductive members 514, 518 are conductive balls, for example. The conductive member 514 is coupled to the bond pad 508, and the conductive member 518 is coupled to a conductive pathway including a conductive trace 526, a via 530, and a conductive ball (e.g., solder ball) 534. In examples, the electrical fuse 512 is similar to the electrical fuse 210 of FIG. 2A, and the description provided above for the electrical fuse 210 also applies to the electrical fuse 512.

Figure 5B:
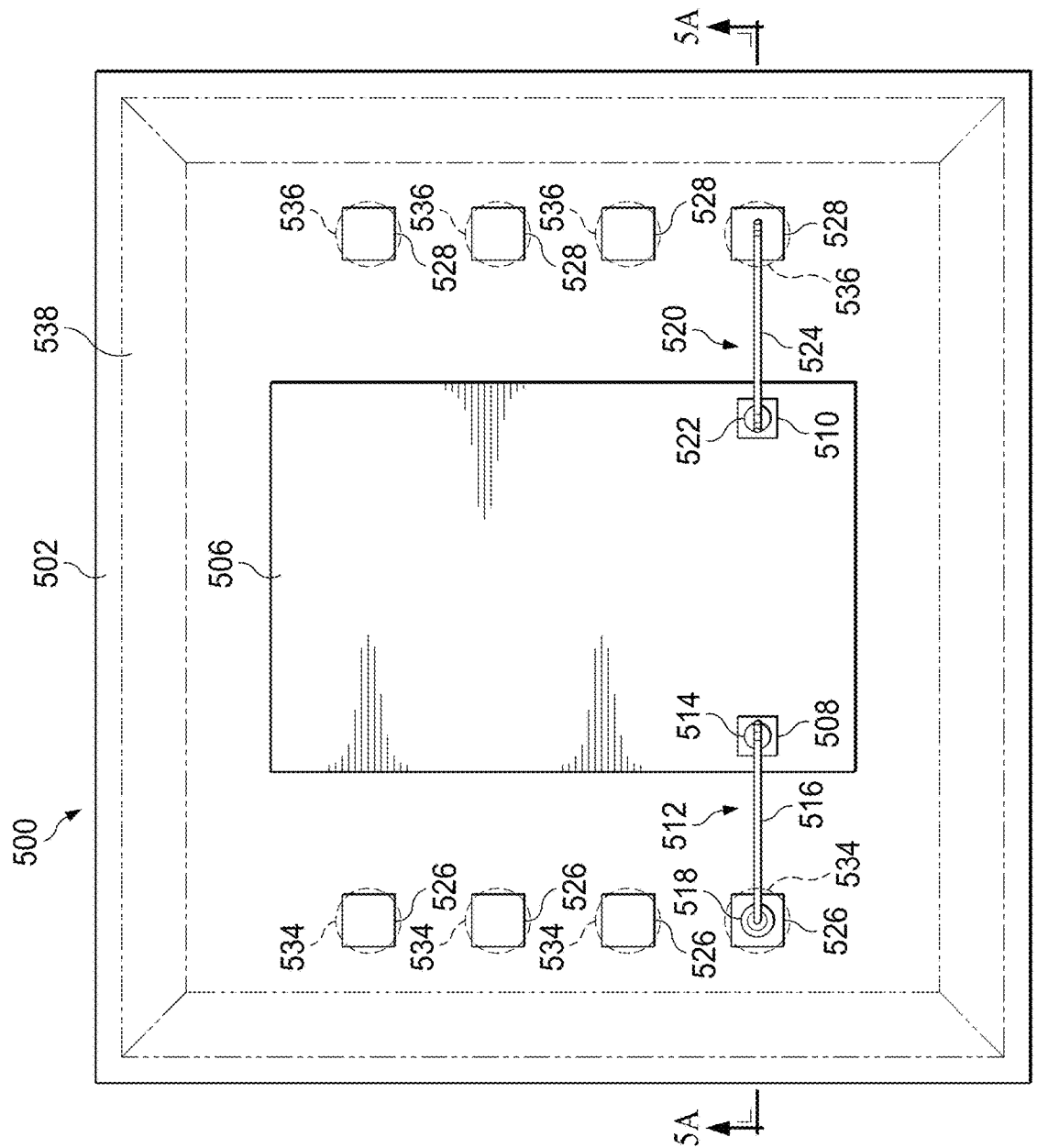
FIG. 5B is a top-down view of a BGA package having an electrical fuse in accordance with various examples.
Figure 5C:
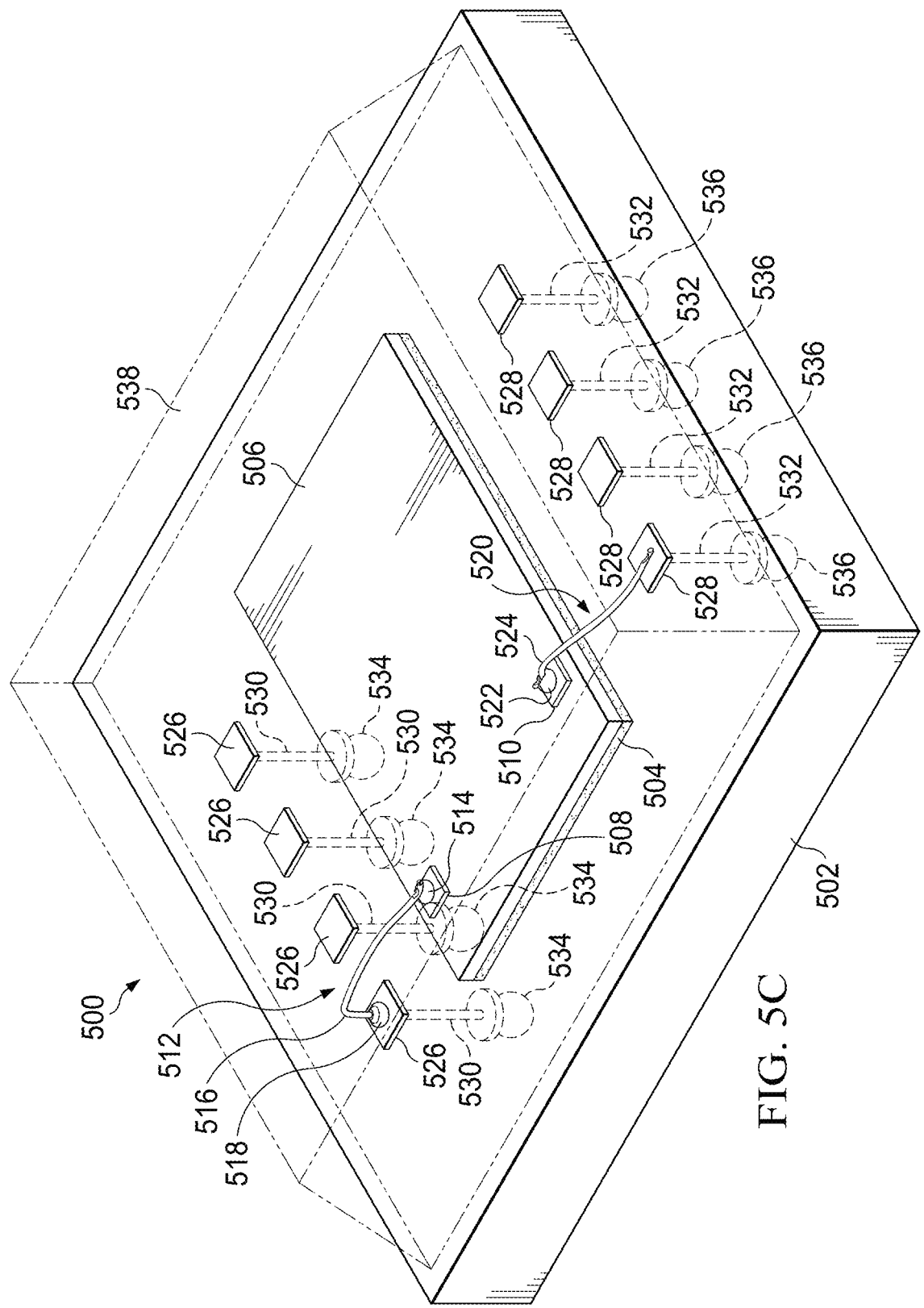
FIG. 5C is a perspective view of a BGA package having an electrical fuse in accordance with various examples.

In examples, the BGA package 500 also includes an electrical fuse 520. The electrical fuse 520 may include a conductive member (e.g., conductive ball) 522 coupled to the bond pad 510 and a bond wire 524 coupled to the conductive member 522. The bond wire 524 may be coupled to a conductive pathway that includes a conductive trace 528, a via 532, and a conductive ball (e.g., solder ball) 536. The description provided above for the electrical fuse 218 also applies to the electrical fuse 520. Although two electrical fuses 512, 520 are shown in FIG. 5A, any number of electrical fuses (e.g., one or more) may be included in the BGA package 500. A mold compound 538 covers components of the BGA package 500 that are above the substrate 502. FIG. 5B is a top-down view of the structure of FIG. 5A. FIG. 5C is a perspective view of the structure of FIG. 5A.

Figure 6A:
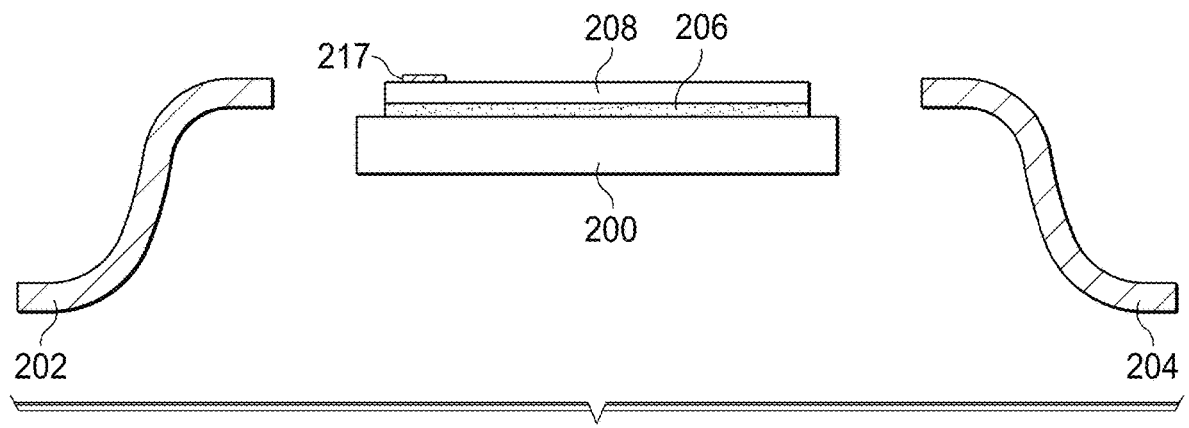
FIGS. 6A-6D are a process flow for manufacturing a semiconductor package having an electrical fuse in accordance with various examples.
Figure 6B:
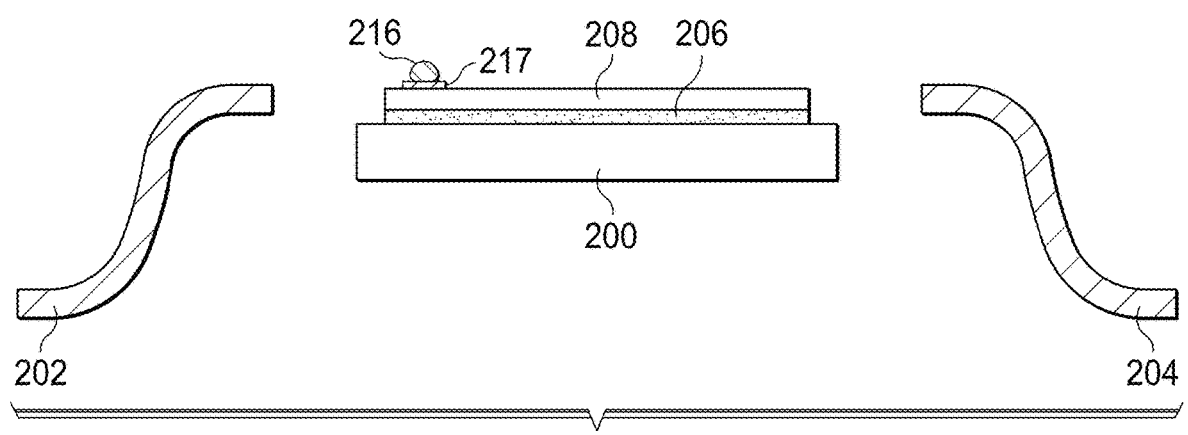
Figure 6C:
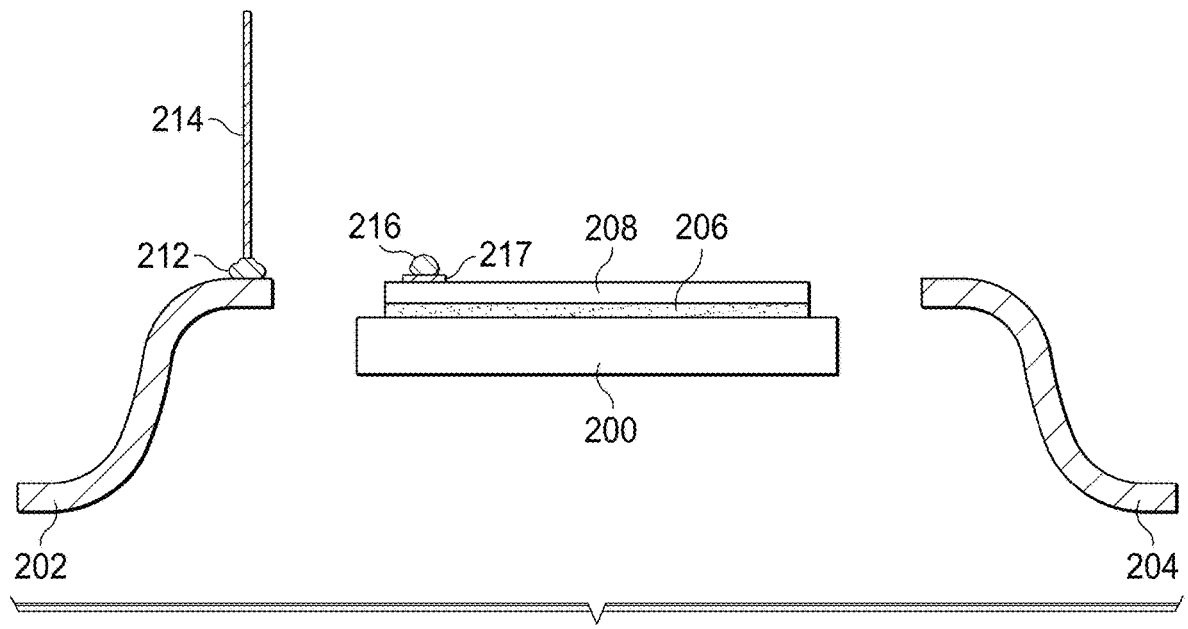
Figure 6D:
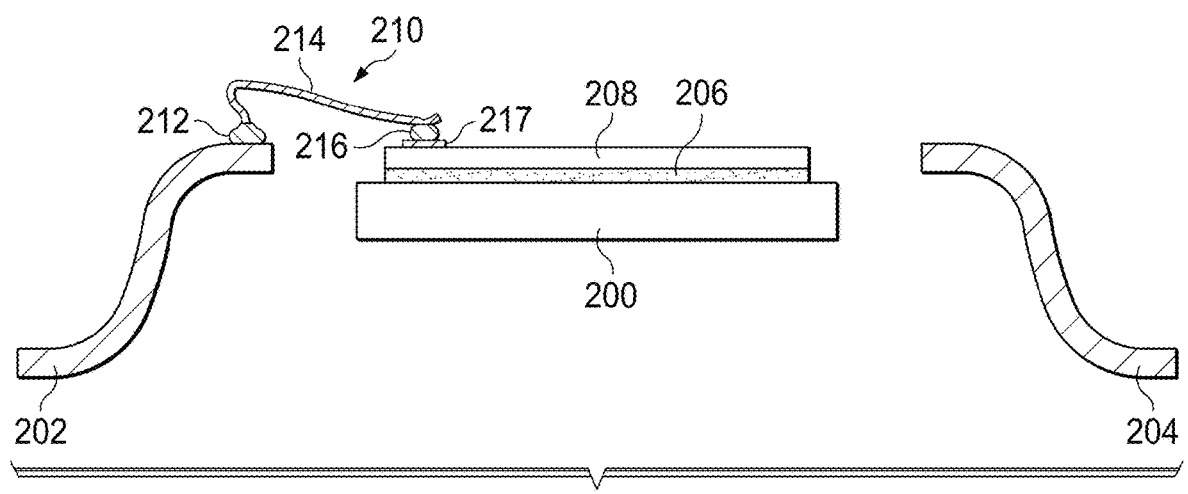
Figure 7:
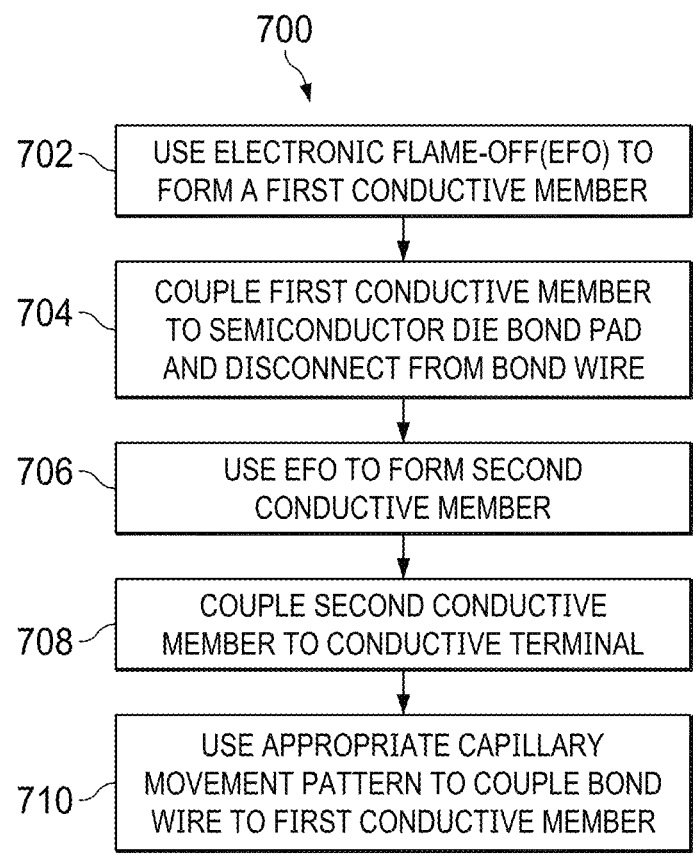
FIG. 7 is a flow diagram of a process for manufacturing a semiconductor package having an electrical fuse in accordance with various examples.

FIGS. 6A-6D are a process flow for manufacturing a semiconductor package having an electrical fuse, such as the packages 104 and 500, in accordance with various examples. FIG. 7 is a flow diagram of a method 700 for manufacturing a semiconductor package having an electrical fuse in accordance with various examples. Accordingly, FIGS. 6A-6D and 7 are described in parallel. The method 700 begins with using EFO to form a first conductive member (e.g., conductive ball) (702), and coupling the first conductive member to a semiconductor die bond pad and disconnecting the first conductive member from the wirebonding capillary bond wire (704). FIG. 6A shows some components of an example semiconductor package, including the die pad 200, die attach layer 206, semiconductor die 208, bond pad 217, and conductive terminals 202, 204. FIG. 6B shows the first conductive member 216 formed on the bond pad 217.

The method 700 includes using EFO to form a second conductive member (e.g., conductive ball) (706) and coupling the second conductive member to a conductive terminal (708). The method 700 also includes using an appropriate capillary (or wedge bonder) movement pattern to couple a bond wire to the first conductive member (710). FIG. 6C depicts the conductive member 212 formed on the conductive terminal 202, with the bond wire 214 extended vertically to an appropriate length to reach the conductive member 216. FIG. 6D shows the bond wire 214 coupled to the conductive member 216 (e.g., using a stitch bond technique). In FIG. 6D, a stitch offset is applied and may be manipulated as described above to produce a target contact area of the interface between the bond wire 214 and the conductive member 216. As also described above, for a fixed stitch offset, differing bond wire 214 lengths may be useful to control the contact area of the interface between the bond wire 214 and the conductive member 216.

Figure 8A:
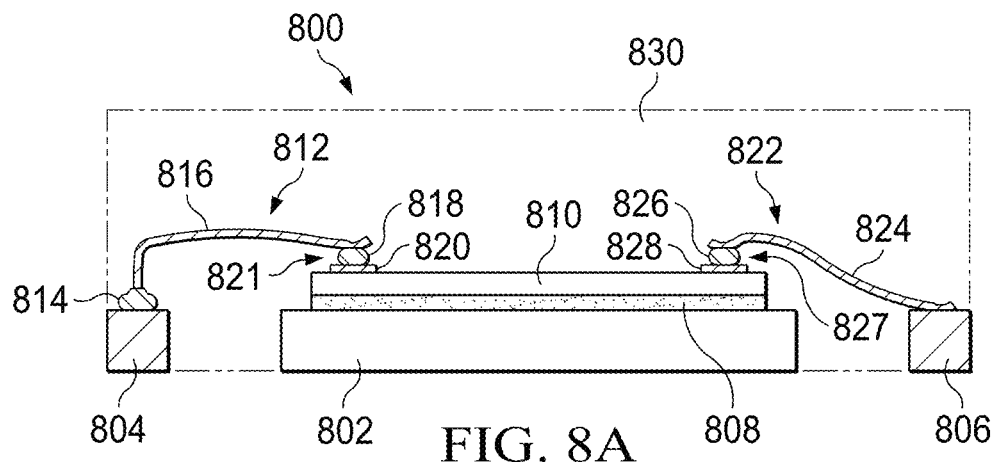
FIG. 8A is a profile cross-sectional view of a quad flat no lead (QFN) package having an electrical fuse in accordance with various examples.

FIG. 8A is a profile cross-sectional view of a quad flat no lead (QFN) package 800 having an electrical fuse in accordance with various examples. The package 800 includes a die pad 802 and conductive terminals 804 and 806. A die attach layer 808 couples a semiconductor die 810 to the die pad 802. A device side of the semiconductor die 810 includes bond pads 820 and 828. The package 800 includes an electrical fuse 812, which includes a conductive member (e.g., conductive ball) 814, a bond wire 816, and a conductive member (e.g., conductive ball) 818. The conductive member 818 is coupled to the bond pad 820. The bond wire 816 may be coupled to the conductive member 818 at an interface 821 using a stitch bond. The package 800 may include an electrical fuse 822. The electrical fuse 822 may include a bond wire 824 coupled to a conductive member (e.g., conductive ball) 826 at an interface 827. The conductive member 826 is coupled to the bond pad 828. The bond wire 824 may be wedge bonded to the conductive member 826 and to the conductive terminal 806. A mold compound 830 covers the various components of the package 800. The description provided herein for the electrical fuses 210 and 512 also apply to the electrical fuse 812. The description provided herein for the electrical fuses 218 and 520 also apply to the electrical fuse 822.

Figure 8B:
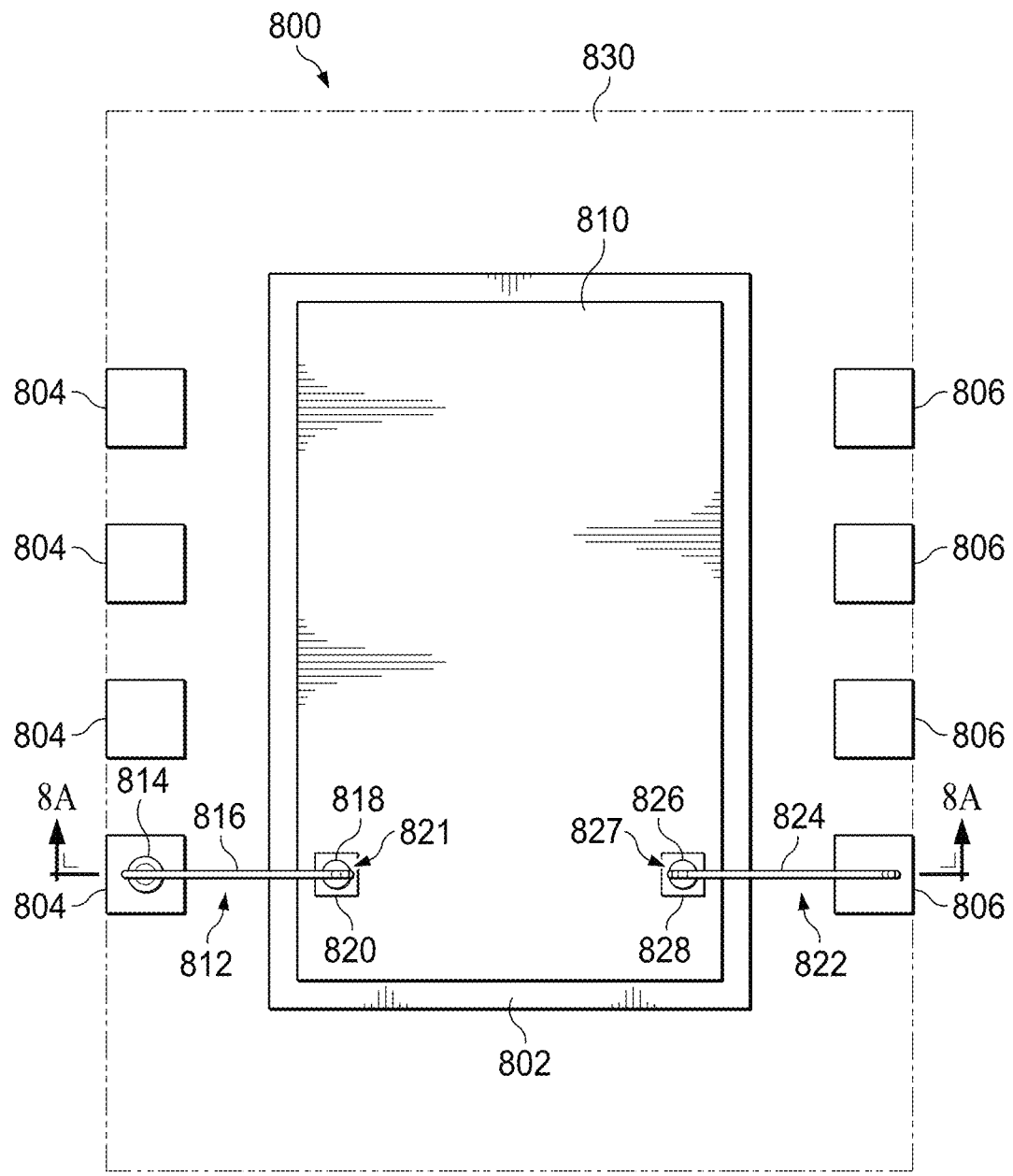
FIG. 8B is a top-down view of a QFN package having an electrical fuse in accordance with various examples.
Figure 8C:
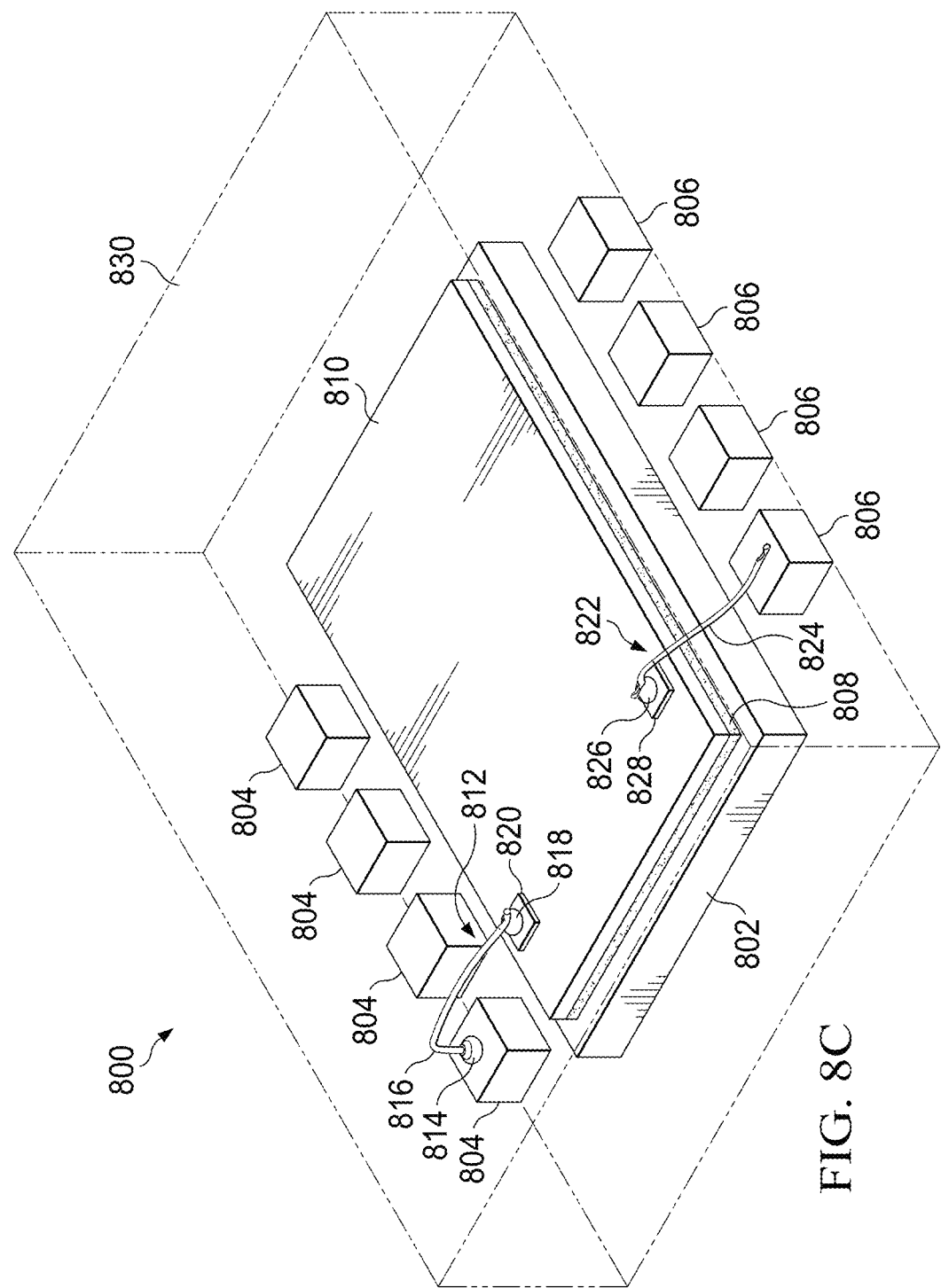
FIG. 8C is a perspective view of a QFN package having an electrical fuse in accordance with various examples.

FIG. 8B is a top-down view of the QFN package 800. FIG. 8C is a perspective view of the QFN package 800.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions.

Unless otherwise stated, "about," "approximately," or "substantially" preceding a value means+/−10 percent of the stated value. Modifications are possible in the described examples, and other examples are possible within the scope of the claims.

What is claimed is:

1. A quad flat no lead (QFN) package, comprising:
   a semiconductor die including a bond pad;
   an electrical fuse comprising:
      a conductive ball on the bond pad; and
      a bond wire including a first end coupled to the conductive ball and a second end ball bonded to a conductive terminal; and
   mold compound covering the electrical fuse, the semiconductor die, and the conductive terminal.

2. The QFN package of claim 1, wherein an interface between the bond wire and the conductive ball is configured to detach in an event of an electrical overload.

3. The QFN package of claim 1, wherein the semiconductor die is attached to a die pad.

4. The QFN package of claim 1, wherein the first end of the bond wire is stitch bonded to the conductive ball.

5. The QFN package of claim 4, wherein a stitch bond between the bond wire and the conductive ball has a stitch offset, an absolute value of the stitch offset not exceeding 30% of a diameter of the bond wire.

6. The QFN package of claim 1, wherein the conductive ball has a height that is between 55% and 65% of a diameter of the bond wire.

7. The QFN package of claim 1, wherein the conductive ball has a height ranging from 0.33 mils to 1.625 mils.

8. The QFN package of claim 1, wherein the bond wire has a diameter ranging from 0.6 mils to 2.5 mils.

9. The QFN package of claim 1, further comprising a second bond wire stitch-bonded to the conductive ball and coupled to the conductive terminal.

10. The QFN package of claim 1, wherein the electrical fuse includes a second conductive ball on the conductive terminal, the bond wire coupled to the second conductive ball.

11. A semiconductor package, comprising:
a semiconductor die including a bond pad;
a conductive terminal including a portion exposed to an exterior of the package; and
an electrical fuse comprising:
a conductive ball on the bond pad; and
a bond wire ball bonded to the conductive terminal, and the bond wire stitch-bonded to the conductive ball.

12. The semiconductor package of claim 11, wherein an interface between the bond wire and the conductive ball is configured to detach in an event of an electrical overload.

13. The semiconductor package of claim 11, wherein the semiconductor die is attached to a die pad.

14. The semiconductor package of claim 11, wherein the first end of the bond wire is stitch bonded to the conductive ball.

15. The semiconductor package of claim 11 further comprising a mold compound covering the electrical fuse, the semiconductor die, and the conductive terminal.

* * * * *